United States Patent
Hung et al.

(10) Patent No.: US 12,066,876 B2
(45) Date of Patent: Aug. 20, 2024

(54) ELECTRONIC SYSTEM WITH A COOLING DEVICE WITH AT LEAST A PRESSING PORTION

(71) Applicant: ASUSTeK COMPUTER INC., Taipei (TW)

(72) Inventors: Kuo-Chin Hung, Taipei (TW); Ching-Yuan Yang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 312 days.

(21) Appl. No.: 17/571,607

(22) Filed: Jan. 10, 2022

(65) Prior Publication Data

US 2022/0229476 A1  Jul. 21, 2022

(30) Foreign Application Priority Data

Jan. 15, 2021  (TW) .................................. 110101671

(51) Int. Cl.
*H05K 7/20* (2006.01)
*G06F 1/20* (2006.01)
*H05K 5/02* (2006.01)

(52) U.S. Cl.
CPC ........... *G06F 1/203* (2013.01); *H05K 5/0204* (2013.01); *H05K 7/20136* (2013.01); *H05K 7/20409* (2013.01); *H05K 7/2049* (2013.01)

(58) Field of Classification Search
None
See application file for complete search history.

(56) References Cited

U.S. PATENT DOCUMENTS

| 5,704,212 | A | * | 1/1998 | Erler | ...................... | F25B 21/04 |
| | | | | | | 361/679.48 |
| 6,084,769 | A | * | 7/2000 | Moore | .................... | G06F 1/203 |
| | | | | | | 361/679.52 |
| 6,191,943 | B1 | * | 2/2001 | Tracy | ...................... | G06F 1/203 |
| | | | | | | 361/679.55 |

(Continued)

FOREIGN PATENT DOCUMENTS

| CN | 200990750 Y | 12/2007 |
| CN | 205039872 U | 2/2016 |

(Continued)

*Primary Examiner* — Zachary Pape
*Assistant Examiner* — Steven Ngo
(74) *Attorney, Agent, or Firm* — McClure, Qualey & Rodack, LLP

(57) ABSTRACT

An electronic system includes an electronic device and a cooling device. The electronic device includes a housing, a heat source, a heat-conducting seat, and a heat-conducting block. The housing includes a space and at least one opening in communication with each other. The heat source and the heat-conducting seat are disposed in the space and contact with each. The heat-conducting seat faces the opening. The heat-conducting block is located at the opening and is connected to the housing. The cooling device includes a pressing portion and a cooling portion. The pressing portion presses the heat-conducting block, to cause the heat-conducting block to move into the space and abut against the heat-conducting seat, so that heat of the heat source is transferred to the pressing portion. The cooling portion is connected to the pressing portion, and dissipates the heat transferred to the pressing portion.

8 Claims, 9 Drawing Sheets

(56) References Cited

U.S. PATENT DOCUMENTS

| | | | |
|---|---|---|---|
| 6,353,536 B1* | 3/2002 | Nakamura | G06F 1/20 |
| | | | 361/679.41 |
| 6,542,360 B2* | 4/2003 | Koizumi | G06F 1/203 |
| | | | 361/689 |
| 8,713,956 B2* | 5/2014 | Couto | G06F 1/1632 |
| | | | 165/80.2 |
| 2018/0239404 A1 | 8/2018 | Siddiqui et al. | |
| 2018/0342932 A1* | 11/2018 | Wachter | H02K 11/33 |
| 2019/0141854 A1* | 5/2019 | Ku | G06F 1/206 |

FOREIGN PATENT DOCUMENTS

| | | |
|---|---|---|
| CN | 110708409 A | 1/2020 |
| CN | 211959300 U | 11/2020 |
| WO | 2015105741 A1 | 7/2015 |

* cited by examiner

ELECTRONIC SYSTEM WITH A COOLING DEVICE WITH AT LEAST A PRESSING PORTION

CROSS-REFERENCE TO RELATED APPLICATION

This application claims the priority benefit of Taiwan application serial No. 110101671, filed on Jan. 15, 2021. The entirety of the above-mentioned patent application is hereby incorporated by reference herein and made a part of the specification.

BACKGROUND OF THE INVENTION

Field of the Invention

The invention relates to an electronic system, and in particular, to an electronic system including a cooling device.

Description of the Related Art

With the advancement of electronic technologies, functions of smartphones have been greatly improved. With the changes of people's life styles, mobile games are increasingly popular. To developing such a new business field, more diversified games are launched with more elaborate pictures, to attract users in the market.

However, to process such complex games, the processors inside the smartphones need to process an increasingly large amount of information at each instant, resulting in increasingly high loads on the processors.

BRIEF SUMMARY OF THE INVENTION

According to an aspect of the disclosure, an electronic system including an electronic device and a cooling device is provided. The electronic device includes a housing, a heat source, a heat-conducting seat, and a heat-conducting block. The housing includes a space and at least one opening in communication with each other. The heat source is disposed in the space. The heat-conducting seat is disposed in the space and is in contact with the heat source. The heat-conducting seat at least partially faces the opening. The heat-conducting block is located at the opening and is elastically connected to the housing. The cooling device includes at least one pressing portion and a cooling portion. The pressing portion is configured to press against the heat-conducting block, to move the heat-conducting block into the space and abut against the heat-conducting seat, so that heat is transferred to the pressing portion through the heat-conducting seat and the heat-conducting block. The cooling portion is connected to the pressing portion, and is configured to dissipate the heat transferred to the pressing portion.

In summary, in the disclosure, the cooling device is mounted on the electronic device, to enable the cooling device to effectively dissipate heat of the heat source of the electronic device. Moreover, a protruding portion of the cooling portion is inserted into a through hole of the housing, and a second joint portion of the cooling portion is snap fitted to a fourth joint portion of the housing to assemble the cooling device and the electronic device without hand tools, and the convenience is thus increased.

In addition, at least a part of a bearing portion abuts against the heat-conducting block when a first end of a holder is not pushed by the protruding portion of the cooling portion. Therefore, the bearing portion prevents the heat-conducting block from contacting with the heat-conducting seat in a case that the cooling device does not abut against the electronic device. Meanwhile, the heat from the heat source does not transfer to the heat-conducting block by the heat-conducting seat, and a user would not touch a hot heat-conducting block. Therefore, the safety while using the electronic device is effectively improved.

Furthermore, in actual applications, when a user considers that the heat generated by the heat source of the electronic device during operation is not high, the user alternatively chooses not to assemble the cooling device on the electronic device. Therefore, the electronic system provides considerable use flexibility.

DETAILED DESCRIPTION OF THE EMBODIMENTS

Figure 1:
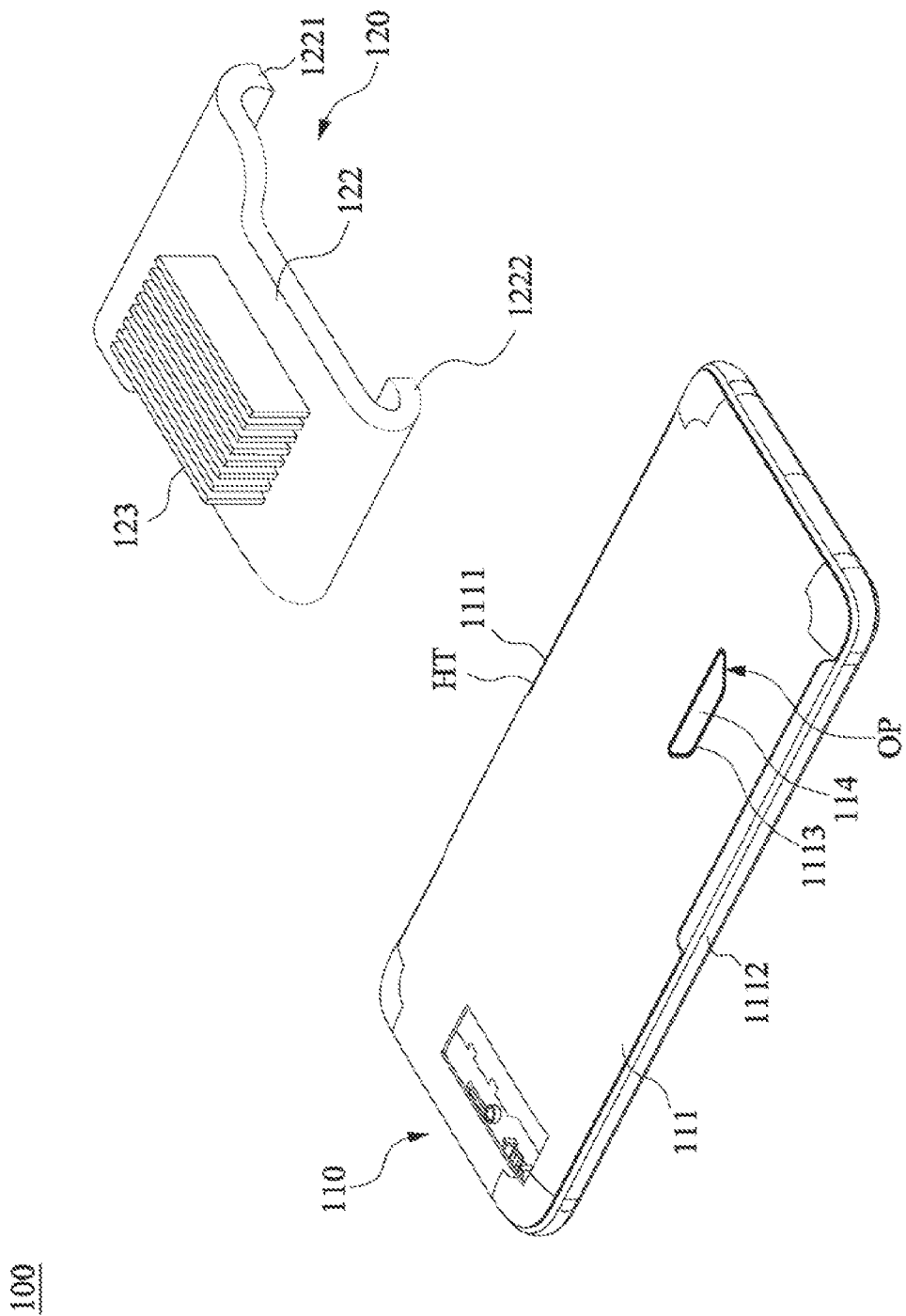
FIG. 1 is a schematic three-dimensional diagram of an electronic system according to an embodiment of the disclosure, where a cooling device is not fixed to an electronic device.
Figure 2:
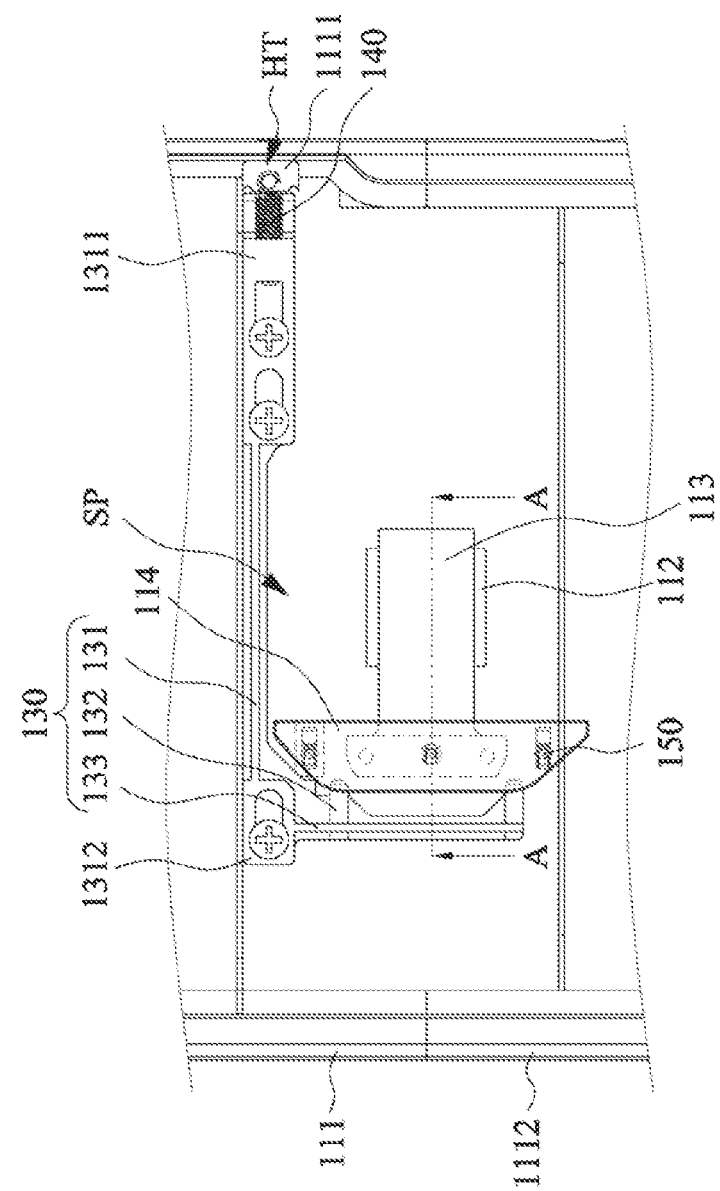
FIG. 2 is a partial perspective top view of the electronic device shown in FIG. 1.
Figure 3:
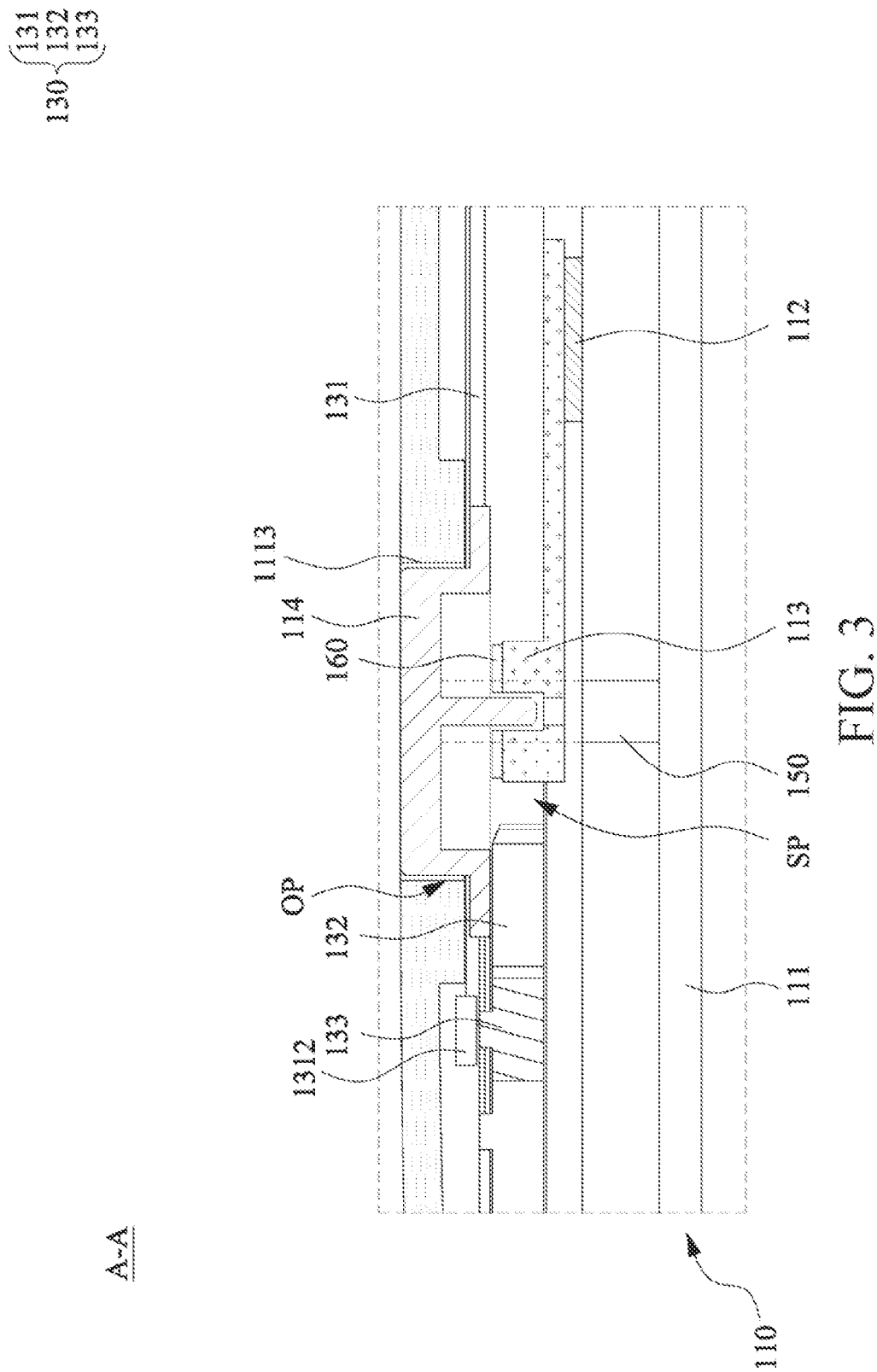
FIG. 3 is a cross-sectional view of FIG. 2 along a line A-A.

Referring to FIG. 1 to FIG. 3, an electronic system 100 includes an electronic device 110 and a cooling device 120. In an embodiment, the electronic device 110 is a smartphone or a tablet computer, but the disclosure is not limited thereto. Specifically, the electronic device 110 includes a housing 111, a heat source 112, a heat-conducting seat 113, and a heat-conducting block 114. The housing 111 includes a space SP and at least one opening OP in communication with each other. The heat source 112 is disposed in the space SP. In an embodiment, the heat source 112 is a central processing unit (CPU), a graphics processing unit (GPU), or the like. During operation of the electronic device 110, the heat source 112 generates considerable amount of heat. The heat-conducting seat 113 is disposed in the space SP and is in contact with the heat source 112. The heat-conducting seat 113 at least partially faces the opening OP. The heat-conducting block 114 is located at the opening OP and is elastically connected to the housing 111. In an embodiment, the heat-conducting block 114 is made of a metal material, and a contour of the heat-conducting block 114 matches a contour of the opening OP. Therefore, the electronic device 110 has a desirable appearance.

Figure 4:
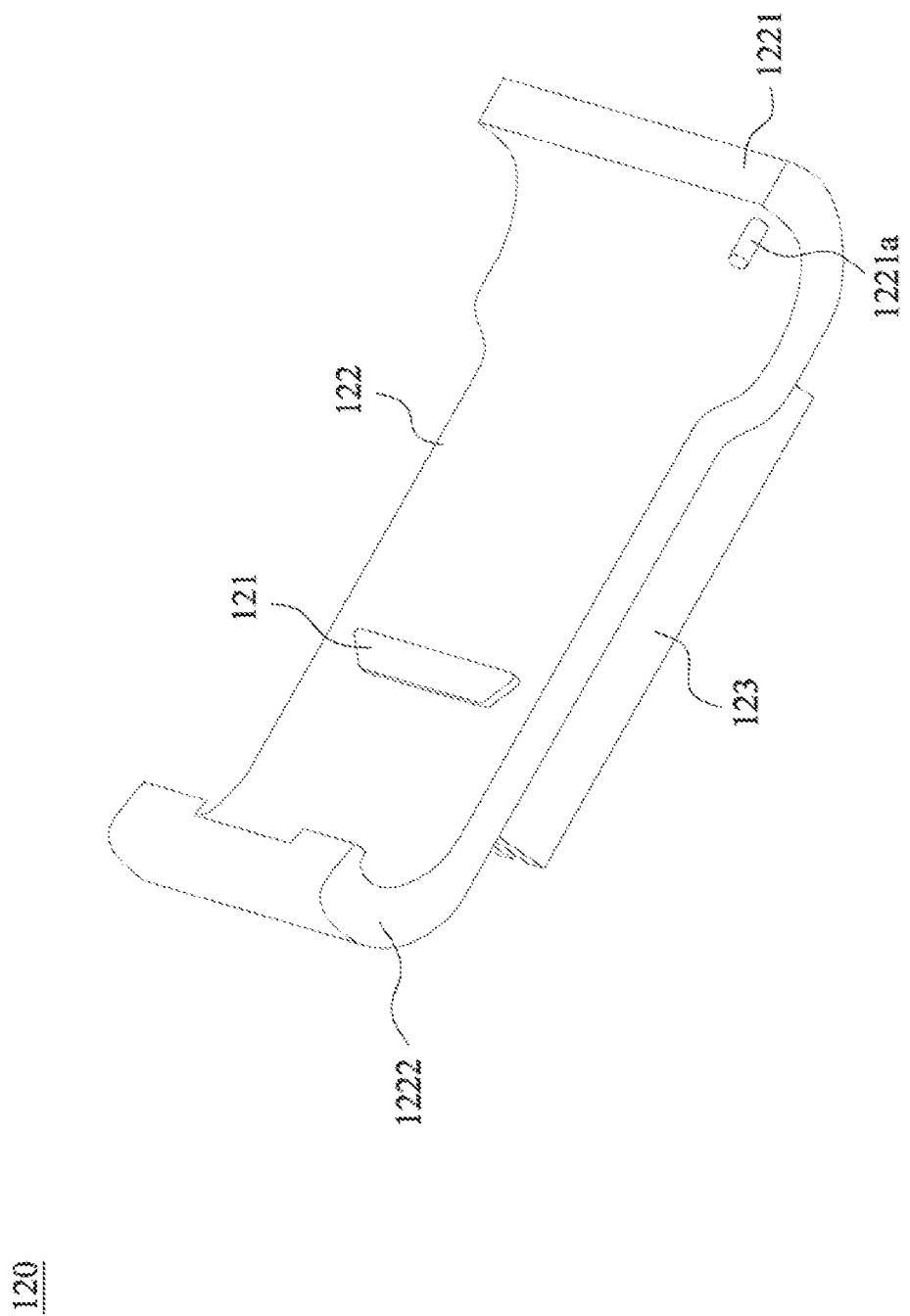
FIG. 4 is a three-dimensional bottom view of the cooling device in FIG. 1.

FIG. 4 is a three-dimensional bottom view of the cooling device 120 in FIG. 1. In this embodiment, as shown in FIG. 1 and FIG. 4, the cooling device 120 includes at least one pressing portion 121 and a cooling portion 122. The cooling portion 122 is connected to the pressing portion 121, and the pressing portion 121 is configured to press against the heat-conducting block 114 of the electronic device 110, to move the heat-conducting block 114 toward the heat-conducting seat 113 and engage with the heat-conducting seat 113. In actual applications, the pressing portion 121 of the cooling device 120 is made of a metal material, to improve the efficiency of heat conduction.

Furthermore, as shown in FIG. 4, the cooling portion 122 of the cooling device 120 includes a first joint portion 1221 and a second joint portion 1222 opposite to each other. In addition, as shown in FIG. 1 and FIG. 2, the housing 111 of the electronic device 110 includes a third joint portion 1111 and a fourth joint portion 1112 opposite to each other. The first joint portion 1221 of the cooling portion 122 is configured to be combined with the third joint portion 1111 of the electronic device 110, and the second joint portion 1222 of the cooling portion 122 is configured to be combined with the fourth joint portion 1112 of the electronic device 110. In an embodiment, the third joint portion 1111 and the fourth joint portion 1112 are two opposite sides of the electronic device 110, but the disclosure is not limited thereto. In an embodiment, the first joint portion 1221 and the second joint portion 1222 are a snap-fit structure, but the disclosure is not limited thereto.

More specifically, in actual applications, as shown in FIG. 4, the first joint portion 1221 of the cooling portion 122 includes at least one protruding portion 1221a. Furthermore, as shown in FIG. 1 and FIG. 2, the third joint portion 1111 of the housing 111 includes at least one through hole HT, and the protruding portion 1221a of the cooling portion 122 is configured to be inserted into the through hole HT of the housing 111. In addition, the fourth joint portion 1112 of the housing 111 is actually a side of the housing 111, and the second joint portion 1222 of the cooling portion 122 is configured to be snap fitted to the fourth joint portion 1112 of the housing 111.

Further, as shown in FIG. 2 and FIG. 3, the electronic device 110 further includes a holder 130. The holder 130 is movably located in the space SP. The holder 130 includes a transmission portion 131, at least one bearing portion 132, and a connecting portion 133. The transmission portion 131 includes a first end 1311 and a second end 1312 opposite to each other, where the first end 1311 is located between the second end 1312 and the through hole HT, and is configured to be pushed by the protruding portion 1221a. When the cooling device 120 is not combined with the electronic device 110, at least a part of the bearing portion 132 abuts against the heat-conducting block 114, to prevent the heat-conducting block 114 from coming into contact with the heat-conducting seat 113. In this way, the heat-conducting seat 113 does not transfer the heat of the heat source 112 to the heat-conducting block 114, and the user does not feel that the heat-conducting block 114 is hot. Based on this, the use safety of the electronic system 100 is effectively improved.

In an embodiment, the housing 111 includes an edge 1113. The edge 1113 surrounds and defines the opening OP. A vertical projection of the edge 1113 on the holder 130 is located between the connecting portion 133 and the first end 1311. The connecting portion 133 is connected to the second end 1312, and the bearing portion 132 is connected to the connecting portion 133. Actually, the transmission portion 131, the bearing portion 132, and the connecting portion 133 are an integrally-formed structure.

Figure 5:
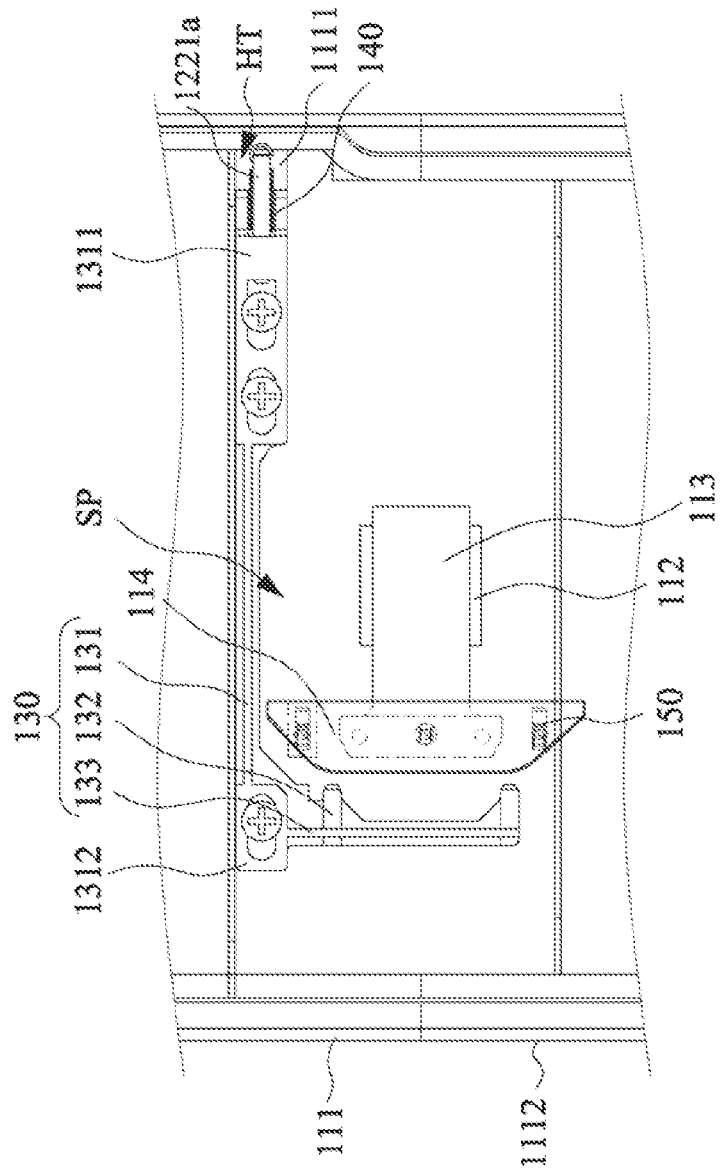
FIG. 5 is a partial perspective top view of the electronic device in FIG. 1, where a bearing portion is away from a path along which a heat-conducting block moves toward a heat-conducting seat.

FIG. 5 is a partial perspective top view of the electronic device 110 in FIG. 1. The bearing portion 132 is away from the heat-conducting block 114 (the heat-conducting block 114 and an internal structure of the electronic device 110 are shown in FIG. 5). Specifically, as shown in FIG. 5, when the protruding portion 1221a (only a part of the protruding portion 1221a is shown in FIG. 5) of the cooling portion 122 is inserted into the through hole HT of the housing 111, the protruding portion 1221a pushes the first end 1311 of the holder 130, to cause the transmission portion 131 of the holder 130 to move away from the through hole HT of the housing 111, and the bearing portion 132 moves with the transmission portion 131 away from the heat-conducting block 114 due to the connecting portion 133. In this case, the bearing portion 132 no longer abuts against the heat-conducting block 114. Therefore, the heat-conducting block 114 moves toward the heat-conducting seat 113 due to gravity.

In other words, when the first end 1311 of the holder 130 is not pushed by the protruding portion 1221a of the cooling portion 122, at least a part of the bearing portion 132 abuts against the heat-conducting block 114, thus to prevent the heat-conducting block 114 contacting with the heat-conducting seat 113.

In an embodiment, as shown in FIG. 2 and FIG. 5, the electronic system 100 further includes at least one first elastic component 140. The first elastic component 140 is located in the space SP, and is elastically connected between the holder 130 and the housing 111. When the first elastic component 140 is in a natural state, at least a part of the bearing portion 132 of the holder 130 abuts against the heat-conducting block 114. When the protruding portion 1221a of the cooling portion 122 is inserted into the through hole HT of the housing 111 to push the first end 1311 of the holder 130, the bearing portion 132 of the holder 130 is away from the heat-conducting block 114, so that the first elastic component 140 is elongated to store a specific amount of elastic potential energy. When the protruding portion 1221a of the cooling portion 122 leaves the through hole HT of the housing 111 and no longer pushes the first end 1311 of the holder 130, the first elastic component 140 releases the stored elastic potential energy to restore the natural state, so that at least a part of the bearing portion 132 of the holder 130 returns again and abuts against the heat-conducting block 114, thereby preventing the heat-conducting block 114 to contact with the heat-conducting seat 113 again.

Figure 6:
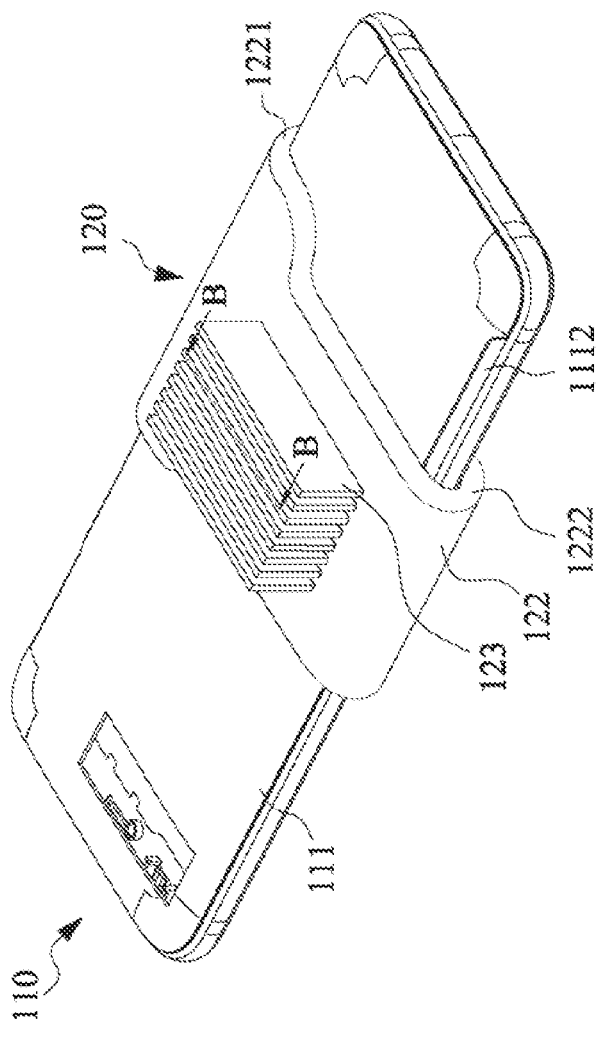
FIG. 6 is a schematic three-dimensional diagram of the electronic system in FIG. 1, where the cooling device is fixed to the electronic device.
Figure 7:
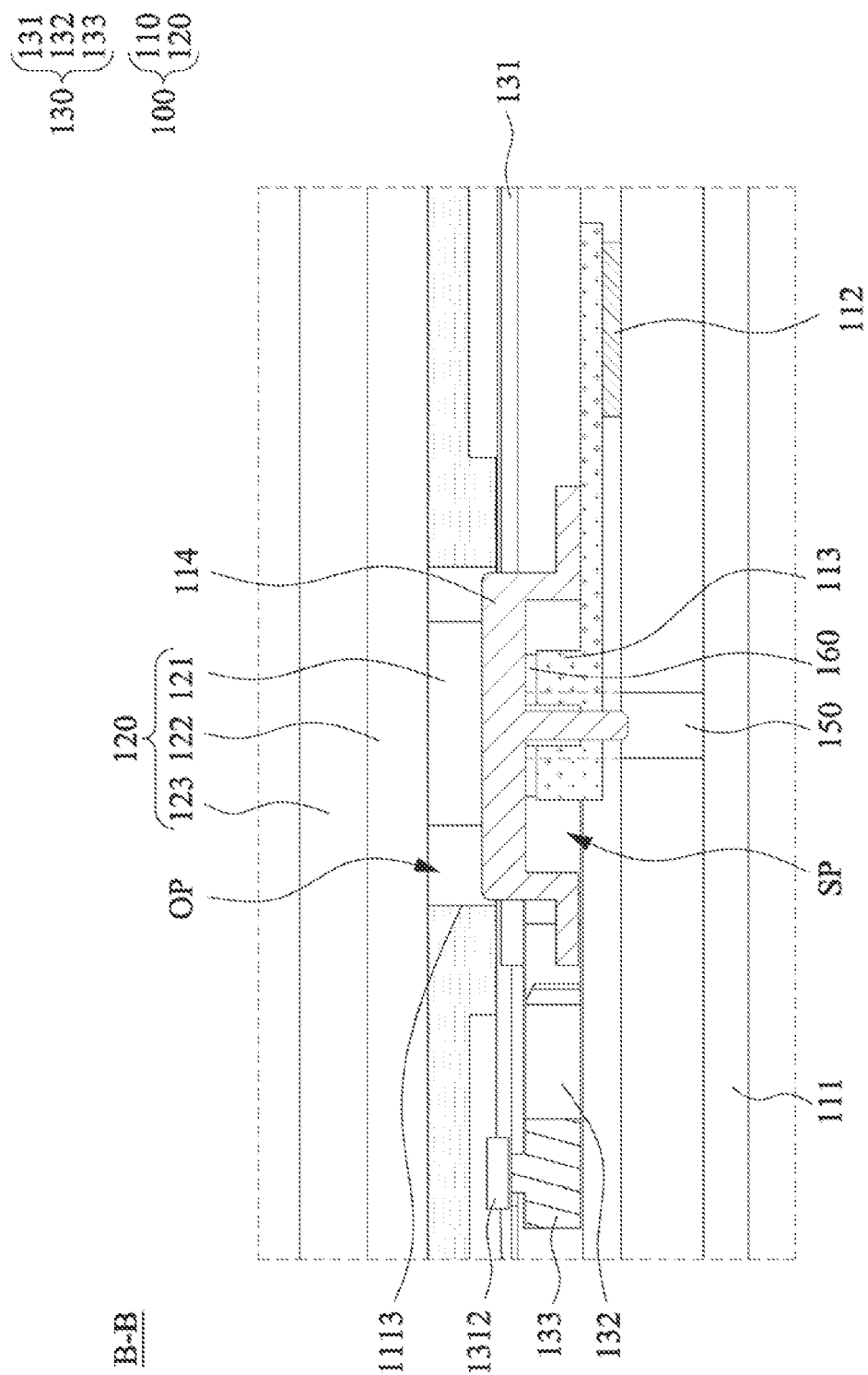
FIG. 7 is a cross-sectional view of FIG. 6 along a line B-B.

FIG. 6 is a schematic three-dimensional diagram of the electronic system 100 in FIG. 1, where the cooling device 120 is fixed to the electronic device 110. FIG. 7 is a cross-sectional view of FIG. 6 along a line B-B. In this embodiment, as shown in FIG. 6 and FIG. 7, the cooling portion 122 of the cooling device 120 abuts against the housing 111 of the electronic device 110. In this case, the protruding portion 1221a of the cooling portion 122 is inserted into the through hole HT of the housing 111, and the second joint portion 1222 of the cooling portion 122 is snap fitted to the fourth joint portion 1112 of the housing 111, to fix relative positions of the cooling device 120 and the electronic device 110. Specifically, in this embodiment, when the second joint portion 1222 of the cooling portion 122 is snap fitted to the fourth joint portion 1112 of the housing 111, as shown in FIG. 6, the second joint portion 1222 covers and is snap fitted to a side of the housing 111.

As described above, when the protruding portion 1221a of the cooling portion 122 is inserted into the through hole HT of the housing 111 to push the first end 1311 of the holder 130, the bearing portion 132 of the holder 130 is away from the heat-conducting block 114. Therefore, when the second joint portion 1222 of the cooling portion 122 is also snap fitted to the fourth joint portion 1112 of the housing 111, the pressing portion 121 of the cooling device 120 presses against the heat-conducting block 114 of the electronic device 110, and causes the heat-conducting block 114 to move into the space SP and further to be engaged with the heat-conducting seat 113, so that the heat of the heat source 112 is transferred to the pressing portion 121 of the cooling device 120 through the heat-conducting seat 113 and the heat-conducting block 114. The cooling portion 122 of the cooling device 120 is configured to dissipate the heat transferred to the pressing portion 121.

In other words, the cooling device 120 is mounted on the electronic device 110, to enable the cooling device 120 to effectively dissipate heat of the heat source 112 of the electronic device 110. Moreover, as described above, the protruding portion 1221a of the cooling portion 122 is inserted into the through hole HT of the housing 111, and the second joint portion 1222 of the cooling portion 122 is snap fitted to the fourth joint portion 1112 of the housing 111, to assemble the cooling device 120 and the electronic device 110 without hand tools and the convenience is thus increased.

Furthermore, when a user considers that the heat generated by the heat source 112 of the electronic device 110 during operation is not high, the user alternatively chooses not to assemble the cooling device 120 on the electronic device 110. Therefore, the electronic system 100 provides considerable use flexibility.

Moreover, in this embodiment, as shown in FIG. 3 and FIG. 7, the electronic system 100 further includes a cooling pad 160. Specifically, the cooling pad 160 is disposed on a side of the heat-conducting seat 113 facing the heat-conducting block 114. Therefore, a better thermal contact effect is formed between the heat-conducting block 114 and the heat-conducting seat 113.

In addition, in this embodiment, as shown in FIG. 3 and FIG. 7, the electronic system 100 further includes at least one second elastic component 150. The second elastic component 150 is located in the space SP, and is elastically connected between the heat-conducting block 114 and the housing 111. When the second elastic component 150 is in a natural state, the heat-conducting block 114 is at least partially located at the opening OP. When the pressing portion 121 of the cooling device 120 presses against the heat-conducting block 114 of the electronic device 110, and causes the heat-conducting block 114 to move into the space SP to abut against the heat-conducting seat 113, the second elastic component 150 is compressed to store a specific amount of elastic potential energy. When the cooling device 120 leaves the electronic device 110, and the pressing portion 121 of the cooling device 120 leaves the heat-conducting block 114 of the electronic device 110, the second elastic component 150 releases the stored elastic potential energy to restore the natural state, and the heat-conducting block 114 is also at least partially located at the opening OP again, to maintain an appearance of the electronic device 110.

In some embodiments, as shown in FIG. 1, FIG. 4, and FIG. 7, the cooling device 120 further includes a plurality of cooling fins 123, to improve a heat dissipation effect of the cooling device 120, but the disclosure is not limited thereto.

Figure 8:
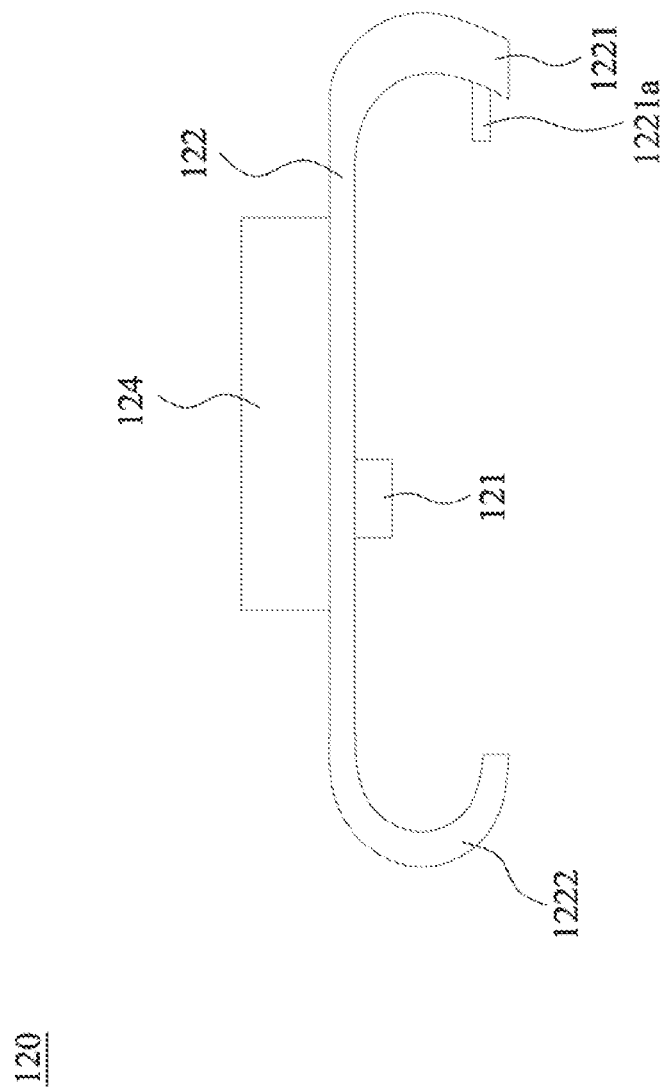
FIG. 8 is a side view of a cooling device according to an embodiment of the disclosure.

FIG. 8 is a side view of a cooling device 120 according to another embodiment of the disclosure. In this embodiment, as shown in FIG. 8, the cooling portion 122 of the cooling device 120 includes at least one fan 124, to improve the heat dissipation effect of the cooling device 120, but the disclosure is not limited thereto.

Figure 9:
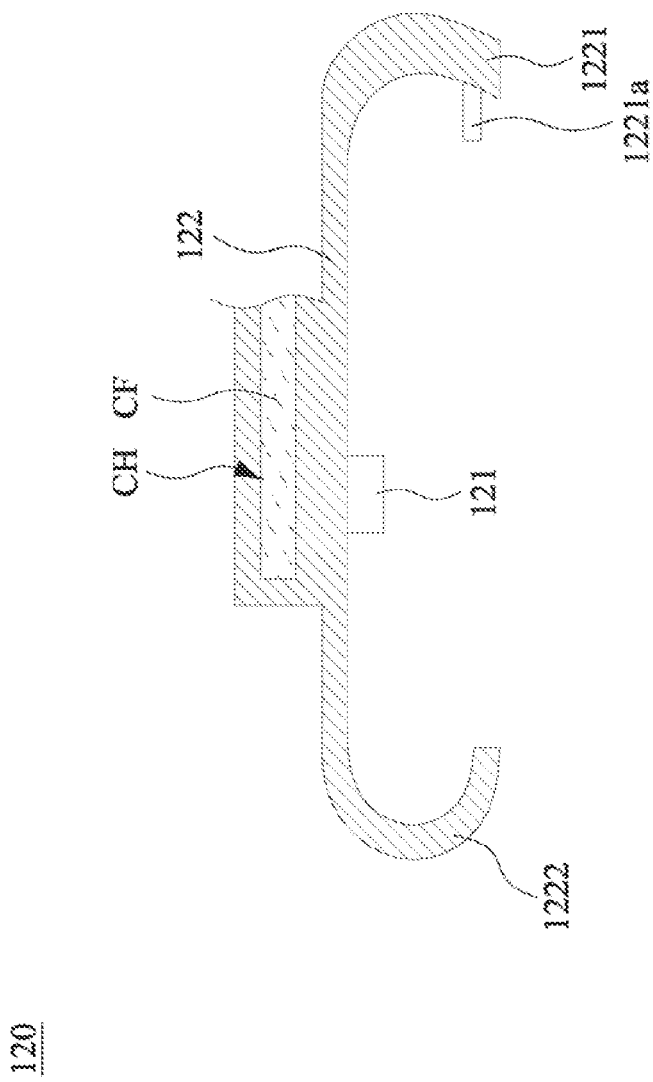
FIG. 9 is a partial cross-sectional view of a cooling device according to still another embodiment of the disclosure.

FIG. 9 is a partial cross-sectional view of a cooling device 120 according to still another embodiment of the disclosure. In this embodiment, as shown in FIG. 9, the cooling portion 122 of the cooling device 120 includes at least one flow channel CH. The flow channel CH is configured to allow a cooling fluid CF to flow therein, to improve the heat dissipation effect of the cooling device 120, but the disclosure is not limited thereto.

In summary, in an electronic system of the disclosure, a cooling device is selectively assembled on an electronic device, to enable the cooling device to effectively dissipate heat of a heat source of the electronic device. Moreover, a protruding portion of the cooling portion is inserted into a through hole of the housing, and a second joint portion of the cooling portion is snap fitted to a fourth joint portion of the housing to assemble the cooling device and the electronic device without hand tools, and the convenience is thus increased.

In addition, at least a part of a bearing portion abuts against the heat-conducting block when a first end of a holder of the electronic system is not pushed by the protruding portion of the cooling portion. Therefore, the bearing portion continuously prevents the heat-conducting block from coming into contact with the heat-conducting seat in a case that the cooling device does not abut against the electronic device. In this way, the heat-conducting seat does not transfer the heat of the heat source to the heat-conducting block, and a user does not touch the hot heat-conducting block by mistake. Therefore, the use safety of the electronic device is effectively improved.

Furthermore, when a user considers that the heat generated by the heat source of the electronic device during operation is not high, the user alternatively chooses not to mount the cooling device on the electronic device. Therefore, the electronic system provides considerable use flexibility.

What is claimed is:
1. An electronic system, comprising:
an electronic device, comprising:
  a housing, comprising a space and at least one edge surrounding and defining an opening in communication with the space, the housing comprising a first joint portion and a second joint portion opposite to each other, the first joint portion comprising at least one through hole;
  a heat source, disposed in the space;
  a heat-conducting seat, disposed in the space and in contact with the heat source, wherein the heat-conducting seat at least partially faces the opening;
  a heat-conducting block, located at the opening and elastically connected to the housing; and
  a holder, movably located in the space, the holder comprising:
    a transmission portion, comprising a first end and a second end opposite to each other, the first end being located between the second end and the through hole;
    at least one bearing portion, at least a part of the bearing portion abutting against the heat-conducting block to prevent the heat-conducting block from coming into contact with the heat-conducting seat; and
    a connecting portion, a vertical projection of the edge on the holder being located between the connecting portion and the first end, and the connecting portion being connected to the second end and the bearing portion; and a cooling device, comprising:

at least one pressing portion, configured to press against the heat-conducting block, to move the heat-conducting block into the space and abut against the heat-conducting seat, so that heat of the heat source is transferred to the pressing portion through the heat-conducting seat and the heat-conducting block; and a cooling portion, connected to the pressing portion, and configured to dissipate the heat transferred to the pressing portion, the cooling portion comprising a third joint portion and a fourth joint portion opposite to each other, the third joint portion comprising at least one protruding portion, the first end being configured to be pushed by the protruding portion, the protruding portion being configured to be inserted into the through hole, wherein when the cooling portion abuts against the housing, the third joint portion is combined with the first joint portion, the protruding portion is inserted into the through hole, and the fourth joint portion is snap fitted to the second joint portion to fix relative positions of the cooling device and the electronic device, and when the protruding portion pushes the first end, the bearing portion moves with the transmission portion away from the heat-conducting block.

2. The electronic system according to claim 1, further comprising at least one first elastic component, located in the space, and elastically connected between the holder and the housing, wherein when the first elastic component is in a natural state, at least a part of the bearing portion abuts against the heat-conducting block.

3. The electronic system according to claim 1, further comprising at least one second elastic component, located in the space, and elastically connected between the heat-conducting block and the housing, wherein, the heat-conducting block is at least partially located at the opening when the second elastic component is in a natural state.

4. The electronic system according to claim 1, further comprising a cooling pad, disposed on a side of the heat-conducting seat facing the heat-conducting block.

5. The electronic system according to claim 1, wherein a contour of the heat-conducting block matches a contour of the opening.

6. The electronic system according to claim 1, wherein the cooling portion comprises a plurality of cooling fins.

7. The electronic system according to claim 1, wherein the cooling portion comprises at least one fan.

8. The electronic system according to claim 1, wherein the cooling portion comprises at least one flow channel, and the flow channel is configured to allow a cooling fluid to flow therein.

* * * * *